United States Patent
Tanaka et al.

(10) Patent No.: US 9,079,390 B2
(45) Date of Patent: *Jul. 14, 2015

(54) SCREEN PRINTING DEVICE AND SCREEN PRINTING METHOD

(75) Inventors: Tetsuya Tanaka, Yamanashi (JP); Yuuji Ootake, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 93 days.

This patent is subject to a terminal disclaimer.

(21) Appl. No.: 14/000,742

(22) PCT Filed: Mar. 2, 2012

(86) PCT No.: PCT/JP2012/001455
§ 371 (c)(1),
(2), (4) Date: Aug. 21, 2013

(87) PCT Pub. No.: WO2012/120861
PCT Pub. Date: Sep. 13, 2012

(65) Prior Publication Data
US 2013/0319267 A1 Dec. 5, 2013

(30) Foreign Application Priority Data

Mar. 9, 2011 (JP) .................................. 2011-051207

(51) Int. Cl.
| | |
|---|---|
| H05K 3/12 | (2006.01) |
| B41F 33/00 | (2006.01) |
| B05C 17/06 | (2006.01) |
| B41M 1/12 | (2006.01) |
| B41F 1/34 | (2006.01) |
| B41F 15/08 | (2006.01) |
| B41F 15/44 | (2006.01) |
| B41F 15/42 | (2006.01) |

(52) U.S. Cl.
CPC ............. *B41F 15/44* (2013.01); *B41F 15/0818* (2013.01); *B41F 15/42* (2013.01); *B41F 15/423* (2013.01); *H05K 3/1233* (2013.01); *H05K 2203/0139* (2013.01)

(58) Field of Classification Search
CPC .... B41F 15/0818; B41F 15/085; B41F 15/42; B41F 15/26; B41F 15/36; B41F 15/44; B41F 15/46; B41F 15/0881; B41F 15/423; H05K 3/1233; H05K 3/3484; H05K 2203/0139; B41M 1/12
USPC .......................................... 101/123, 126, 129
See application file for complete search history.

(56) References Cited

U.S. PATENT DOCUMENTS

| | | | |
|---|---|---|---|
| 5,287,806 A | | 2/1994 | Nanzai |
| 5,947,022 A | * | 9/1999 | Freeman et al. .............. 101/123 |

(Continued)

FOREIGN PATENT DOCUMENTS

| | | | |
|---|---|---|---|
| JP | 04-014451 A | 1/1992 | |
| JP | 05166167 | * 6/1994 | .............. B41F 14/40 |

(Continued)

OTHER PUBLICATIONS

International Search Report for PCT/jP2012/001455 dated Apr. 17, 2012.

*Primary Examiner* — Jill Culler
*Assistant Examiner* — Marissa Ferguson Samreth
(74) *Attorney, Agent, or Firm* — Pearne & Gordon LLP

(57) ABSTRACT

In outward path and returning path operations of a printing executing step where paste is packed into pattern holes by moving a closed type squeegee mechanism in a squeezing direction, the paste supplied to the outside of the closed type squeegee mechanism on an upper surface of a mask is spread due to a deposition members by moving the deposition members of paste deposition mechanisms positioned on a following side in a traveling direction, in the traveling direction in a state close to the upper surface of the mask. Therefore, a paste film having a predetermined thickness is formed.

4 Claims, 7 Drawing Sheets

(56) References Cited

U.S. PATENT DOCUMENTS 6,591,745 B2 * 7/2003 Miyahara et al. ............. 101/123
6,820,544 B2 * 11/2004 Miyahara et al. ............. 101/123
8,561,535 B2 * 10/2013 Sabia et al. .................. 101/129

FOREIGN PATENT DOCUMENTS

| JP | 8-99402 A | 4/1996 |
| JP | 2001-347636 A | 12/2001 |
| JP | 2006-272584 A | 10/2006 |

* cited by examiner

SCREEN PRINTING DEVICE AND SCREEN PRINTING METHOD

TECHNICAL FIELD

The present invention relates to a screen printing device and a screen printing method for printing paste used for part joining, circuit forming or the like on a substrate.

BACKGROUND ART

A screen printing has been known as a method for supplying paste used for part joining, circuit forming or the like on a substrate. According to the method, the paste is printed on an electrode plane of a substrate via pattern holes provided on a screen mask. For carrying out the method, a screen printing device provided with a screen printing mechanism in which a squeegee unit slides on an upper surface of the screen mask in a state of abutting the substrate on a lower surface of the screen mask has been used (see PTL 1, for example).

In an example shown in PTL 1, a closed type squeegee mechanism has been used as a squeegee unit. The closed type squeegee mechanism is configured so that a cartridge storing paste is mounted therein, and the paste is packed into pattern holes by a compression force produced by compressing the paste in the cartridge. Upon comparison with a simple squeezing operation of filling paste into pattern holes by moving a squeegee, which is performed by a conventional open-type squeegee, the closed type squeegee mechanism described above has an excellent packing property. Therefore, in this case, a mesh mask which is formed by sealing a metallic mesh material with resin may be suitably used as a screen mask for printing, for example, where the mesh mask is difficult to expect a favorable packing property in the case of the conventional squeegee.

CITATION LIST

Patent Literature

[PTL 1] JP-A-2006-272584

SUMMARY OF INVENTION

Technical Problem

However, in the case of a screen printing with respect to the mesh mask described above, disadvantages to be described below have been caused due to properties of the mesh mask. That is, when a screen printing device using a closed type squeegee mechanism performs a squeezing operation, paste on an upper surface of the mesh mask is scraped by a sliding member on a following side. Therefore, the paste packed into pattern holes of the mesh mask is completely exposed after squeezing is finished. Thus, the paste in the mesh is rapidly dried by being exposed to the air, so that it is easy to be in a clogging state. If the screen printing work is continuously performed in a state described above, disadvantages are caused in a plate-removing process where the paste is separated from the pattern holes, or a packing property of the paste is deteriorated in succeeding printing. As a result, a printing failure is caused. As described above, in conventional screen printing with respect to a mesh mask, there is a problem in that it is difficult to prevent a printing failure caused by drying of paste in pattern holes.

Therefore, an object of the invention is to provide a screen printing device and a screen printing method capable of preventing a printing failure caused by drying of paste in pattern holes.

Solution to Problem

A screen printing device according to one aspect of the invention is a screen printing device for printing paste on a substrate via pattern holes by performing a reciprocating squeezing operation in which a squeegee unit reciprocatively slides in a squeezing direction in a state of abutting on an upper surface of a mesh mask formed with the pattern holes, comprising:

a substrate underlaid bracket portion which receives and holds the substrate;

a squeegee moving mechanism which causes the squeegee unit to be moved upward or downward and moved reciprocatively in the squeezing direction, and two paste deposition mechanisms which are symmetrically disposed on outward path and returning path sides of the squeegee unit in the squeezing direction, reciprocatively movable in synchronization with the squeegee unit, and respectively having deposition members moving upward or downward with respect to the mesh mask, wherein the squeegee unit is a closed type squeegee mechanism which is configured so that a pair of sliding members opposed to each other in a downward-narrowed state extend downward from a lower surface side of a main body portion storing the paste so as to align a facing direction thereof with the squeezing direction, and compresses the paste stored in the main body portion and reciprocatively slides the sliding member in the squeezing direction in a state of being abutted on the upper surface of the mesh mask so that the paste is packed into the pattern holes via a printing opening provided between the sliding members, and wherein, in outward path and returning path operations for reciprocatively moving the squeegee unit in the squeezing direction, the paste supplied to the outside of the closed type squeegee mechanism on the upper surface of the mesh mask is spread due to the deposition members by moving, in a traveling direction, the deposition members of the paste deposition mechanisms positioned on a following side in the traveling direction, in a state close to the upper surface of the mesh mask, thereby forming a paste film having a predetermined thickness.

A screen printing method according to one aspect of the invention is a screen printing method for printing paste on a substrate via pattern holes by performing a reciprocating squeezing operation in which a squeegee unit reciprocatively slides in a squeezing direction in a state of abutting on an upper surface of a mesh mask formed with the pattern holes, in which the squeegee unit is a closed type squeegee mechanism which is configured so that a pair of sliding members opposed to each other in a downward-narrowed state extend downward from a lower surface side of a main body portion storing the paste so as to align a facing direction thereof with the squeezing direction, and compresses the paste stored in the main body portion and reciprocatively slides the sliding member in the squeezing direction in a state of being abutted on the upper surface of the mesh mask so that the paste is packed into the pattern holes via a printing opening provided between the sliding members, and further two paste deposition mechanisms, each of which is reciprocatively movable in synchronization with the squeegee unit and has deposition member moving upward or downward with respect to the mesh mask, are symmetrically disposed on an outward path and returning path sides of the squeegee unit in the squeezing thereof, the method comprising:

a substrate positioning step which positions the substrate received and held by a substrate underlaid bracket portion, with respect to the mesh mask;

a paste supplying step which supplies the paste to the outside of the closed type squeegee mechanism on the upper surface of the mesh mask; and a printing executing step which reciprocatively moves the squeeze unit on the upper surface of the mesh mask, wherein, in outward path and returning path operations of the printing executing step for reciprocatively moving the squeegee unit in the squeezing direction, the paste supplied to the outside of the closed type squeegee mechanism on the upper surface of the mesh mask is spread due to the deposition members by moving, in a traveling direction, the deposition members of the paste deposition mechanisms positioned on a following side in the traveling direction, in a state close to the upper surface of the mesh mask, thereby forming a paste film having a predetermined thickness.

Advantageous Effects of Invention

According to the invention, in outward path and returning path operations of a printing executing step where paste is packed into pattern holes by reciprocatively moving a squeegee unit in a squeezing direction, the paste supplied to the outside of a closed type squeegee mechanism on an upper surface of a mesh mask is spread due to a deposition members by moving the deposition members of paste deposition mechanisms positioned on a following side in a traveling direction, in the traveling direction in a state close to the upper surface of the mesh mask. Therefore, a paste film having a predetermined thickness is formed. Thus, it is possible to cover the pattern holes by the paste film, thereby preventing a printing failure caused by drying of the paste in the pattern holes.

DESCRIPTION OF EMBODIMENTS

Next, an embodiment of the invention will be described with reference to drawings. First, a structure of a screen printing device 1 will be described. The screen printing device 1 has a function for printing paste used for solder jointing or circuit forming on a substrate via pattern holes by performing a squeezing operation in which a squeegee unit is slid in a squeezing direction in a state of abutting on an upper surface of a mesh mask formed with the pattern hole.

Figure 1:
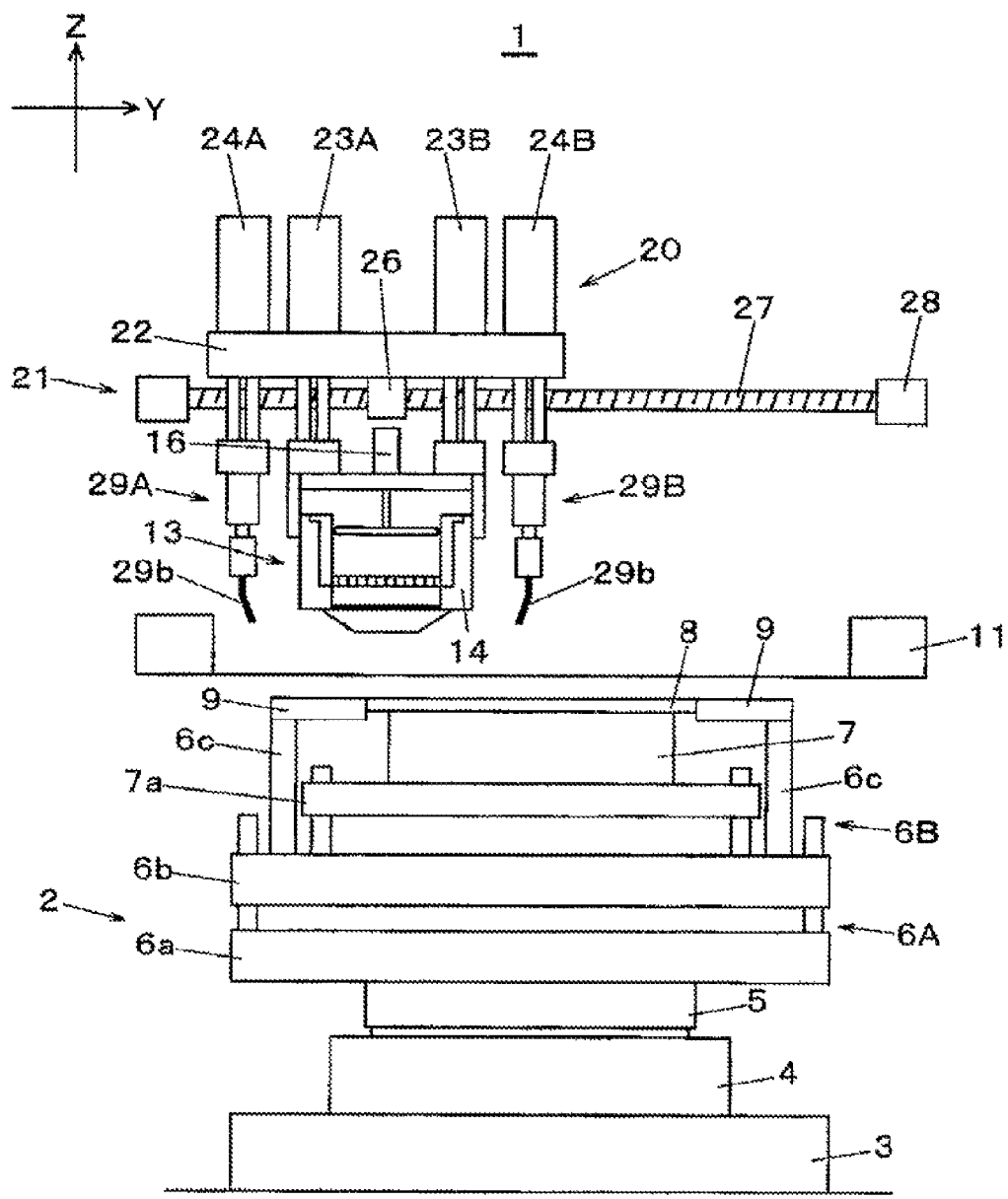
FIG. 1 is a side view of a screen printing device according to an embodiment of the invention.
Figure 2:
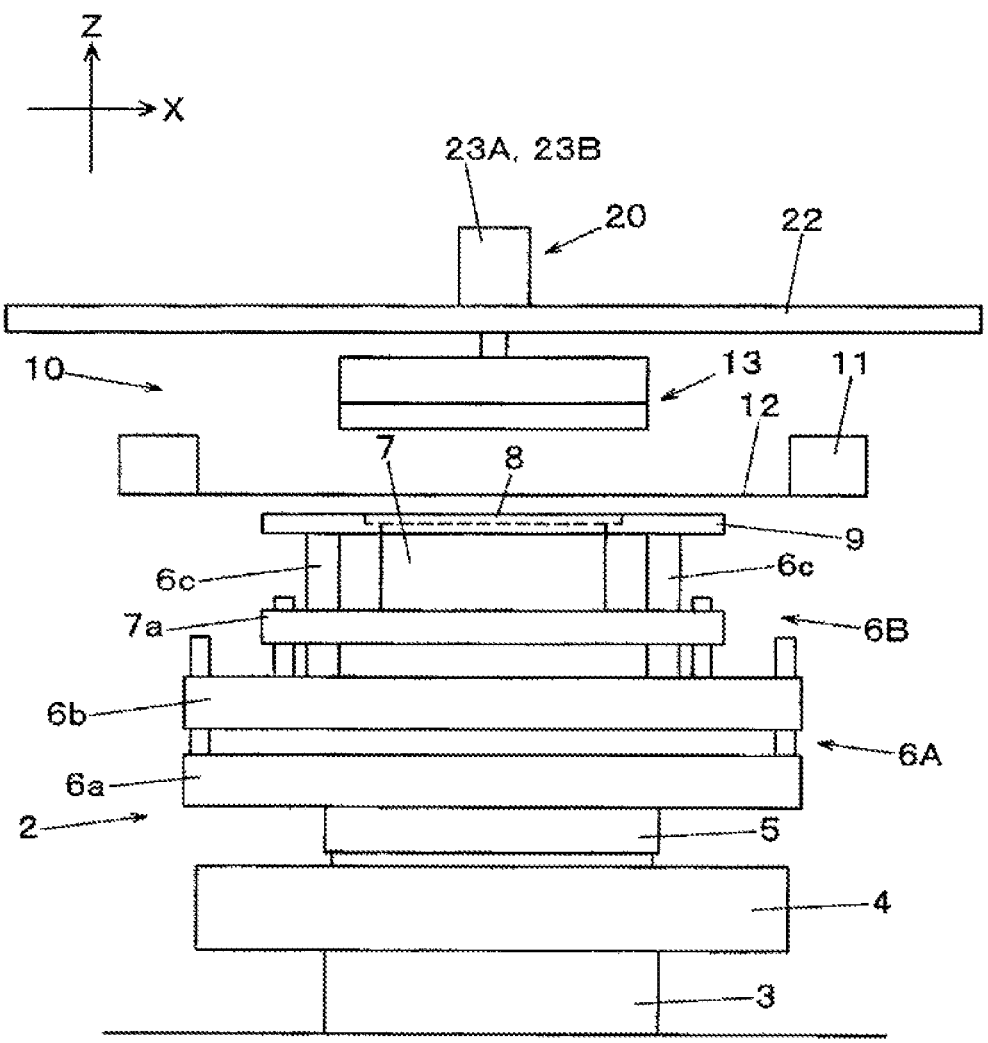
FIG. 2 is a front view of the screen printing device according to the embodiment of the invention.

In FIGS. 1 and 2, a screen printing portion 10 is installed on an upper side of a substrate positioning portion 2 of the screen printing device 1. The substrate positioning portion 2 is configured that a θ-axis table 5 is superimposed on a moving table constituted by a Y-axis table 3 and an X-axis table 4, and a first Z-axis table 6A and a second Z-axis table 6B are installed thereon, and further a substrate underlaid bracket portion 7 is installed on the second Z-axis table 6B. The first Z-axis table 6A is fixed to an upper surface of the θ-axis table 5. A lifting base 6b is moved upward or downward with respect to a fixing base 6a by driving the first Z-axis table 6A.

In addition, by driving the second Z-axis table 6B, an underlaid base 7a and the substrate underlaid bracket portion 7 are moved upward or downward with respect to the lifting base 6b. The substrate underlaid bracket portion 7 receives and holds a substrate 8, as a printing object, which is transported from an upstream-side device in an X direction by a substrate transporting mechanism (not shown). In the lifting base 6b, a pair of clamp members 9 are held via a bracket 6c. The clamp members 9 are opened and closed in a Y direction by an open and close driving mechanism (not shown). In a closed state, the clamp members 9 clamp-fixes the substrate 8, which is received by the substrate underlaid bracket portion 7, by interposing the substrate 8 from both sides thereof.

The screen printing portion 10 installed on the upper side of the substrate positioning portion 2 is configured by mounting, as a screen mask, a mesh mask 12 having a mesh portion 12b on a holder 11. The mesh portion 12b is formed by weaving a metallic thin wire. Pattern holes 12a (see FIG. 3) are opened on the mesh mask 12 so as to correspond to printing sections of the substrate 8 as a printing object. A squeegee unit for performing the squeezing operation on the mesh mask 12 and two paste deposition mechanisms 29A and 29B are installed on an upper side of the screen printing portion 10 so as to be integrally freely moved by a squeegee moving mechanism 20. In this case, a closed type squeegee mechanism 13 is used as a squeegee unit.

The closed type squeegee mechanism 13 is provided with a printing portion 14 held by a connecting member 15. The closed type squeegee mechanism 13 is configured that paste P stored in the printing portion 14 is compressed by a cylinder 16 and packed into the pattern holes 12a (see FIG. 3). The paste deposition mechanisms 29A and 29B have a function to form a coating film of the paste P which covers an upper surface of the mesh mask 12. Further, the paste deposition mechanisms 29A and 29B are configured that deposition members 29b disposed symmetrically with respect to the closed type squeegee mechanism 13 are respectively provided on outward path and returning path sides (right and left sides in the Y direction, in this case) in the squeezing direction of the closed type squeegee mechanism 13 so as to be reciprocatively movable in the squeezing direction in synchronization with the closed type squeegee mechanism 13 and moved upward or downward with respect to the mesh mask 12. A paste film P* having a predetermined thickness is formed on the upper surface of the mesh mask 12 by supplying the paste P on the upper surface of the mesh mask 12 and horizontally moving the paste deposition mechanisms 29A and 29B in a state where the deposition members 29b maintain a predetermined gap with respect to the upper surface of the mesh mask 12 (see FIGS. 6A to 6C).

Figure 3:
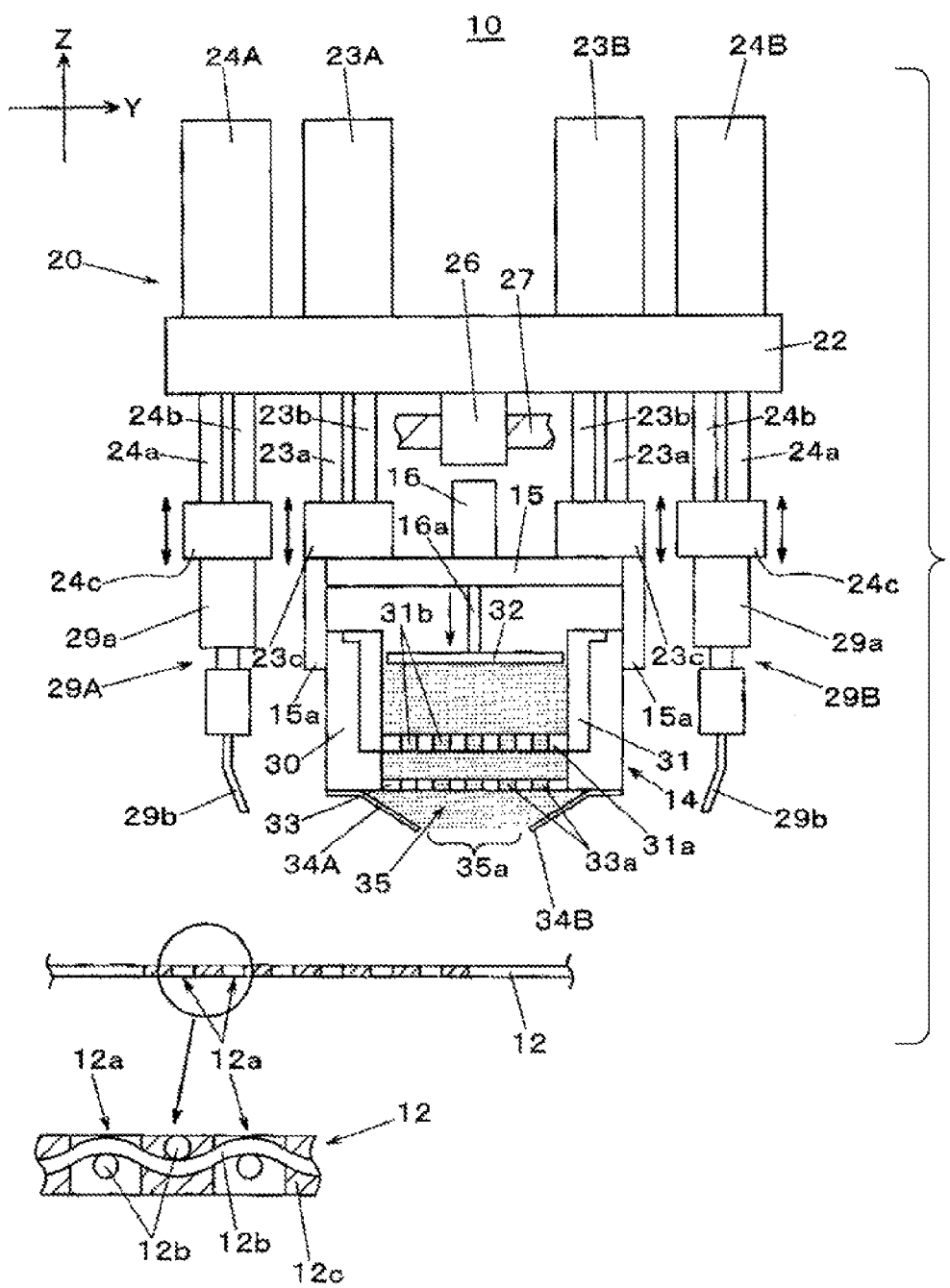
FIG. 3 is a partial cross-sectional side view of the screen printing device according to the embodiment of the invention.

Subsequently, the configurations of the squeegee moving mechanism 20, the closed type squeegee mechanism 13 and the paste deposition mechanisms 29A and 29B will be described with reference to FIG. 3. The squeegee moving mechanism 20 is equipped with a Y-axis moving mechanism 21 for moving a moving plate 22 in the Y direction, squeegee lifting mechanisms 23A and 23B provided on the upper surface of the moving plate 22, and deposition mechanism lifting mechanisms 24A and 24B for respectively moving the paste deposition mechanisms 29A and 29B upward or downward. The squeegee lifting mechanisms 23A and 23B and the deposition mechanism lifting mechanisms 24A and 24B are respectively provided with lifting actuators. A lifting shaft 23a and a lifting shaft, 24a respectively extend on lower sides of the squeegee lifting mechanisms 23A and 23B and the deposition mechanism lifting mechanisms 24A and 24B. The lifting shaft 23a and the lifting shaft 24a are respectively moved upward or downward in a state of being guided by a guide shaft 23b and a guide shaft 24b. The closed type squeegee mechanism 13 is connected to lower end portions of the two lifting shafts 23a via a lifting block 23c and a connecting member 15. Further, each of the deposition member 29b having a squeegee shape held by a holder 29a is connected to a lower end portion of each lifting shaft 24a.

The closed type squeegee mechanism 13 is moved upward or downward with respect to the mesh mask 12 by driving the squeegee lifting mechanisms 23A and 23B. Therefore, the squeegee lifting mechanisms 23A and 23B and the Y-axis moving mechanism 21 function as a squeegee moving mechanism for moving the closed type squeegee mechanism 13 upward or downward and moving the closed type squeegee mechanism 13 in the squeezing direction. In addition, each deposition member 29b is moved upward or downward with respect to the mesh mask 12 by driving the deposition mechanism lifting mechanisms 24A and 24B.

A function of the paste deposition mechanisms 29A and 29B will be described. In a state where the paste P is supplied on the upper surface of the mesh mask 12, the deposition members 29b are moved to a position where a predetermined deposition gap is maintained with respect to the upper surface of the mesh mask 12, and then the paste deposition mechanisms 29A and 29B are respectively moved in outward path and returning path directions. Thereby, the paste film P* (see FIGS. 7A to 7C), which is formed by spreading the paste P due to the deposition members 29b and has a predetermined thickness, is formed on the upper surface of the mesh mask 12. The paste film P* has a function of preventing the progress of drying of the paste P in the pattern holes 12a, by covering the upper surface side of the pattern holes 12a packed with the paste P in the squeezing operation. Therefore, it is possible to prevent clogging in the pattern holes 12a, caused by the paste P.

Hereinafter, the mesh mask 12 used in the embodiment will be described. As shown in an enlarged view of FIG. 3, the mesh mask 12 is configured that the entire range of the mesh portion 12b formed by weaving a metallic thin wire is sealed with a sealing resin 12c, except the range of the pattern holes 12a. The mesh mask described above is used in the case where it is difficult to use, as a screen mask, a conventional metal mask which is made of a metal plate in order to provide linear-shaped pattern holes in which a printing pattern for performing printing for a circuit-forming or the like is continuously formed.

When screen printing is carried out using the mesh mask, the mesh portion 12b is also present in the pattern hole 12a. Therefore, there is a packing-property related problem in that it is difficult to completely fill the paste P into the pattern holes 12a. In addition, upon comparison with a metal mask, the mesh mask has a strength property that the elasticity thereof is great in an in-plane direction and the flexural rigidity thereof is small. Therefore, the mesh mask 12 is suitable for off-contact printing in which only a part of the mesh mask 12 pushed by the closed type squeegee mechanism 13 is abutted on the substrate 8, without causing the entire mesh mask 12 to be brought into contact with the upper surface of the substrate 8 in the squeezing operation by the closed type squeegee mechanism 13.

A configuration of the Y-axis moving mechanism 21 will be described. A nut member 26 is connected to the lower surface of the moving plate 22. A feeding screw 27 screwed into the nut member 26 is rotationally driven by a motor 28. The moving plate 22 is horizontally moved by driving the motor 28, whereby the closed type squeegee mechanism 13 connected to the squeegee lifting mechanisms 23A and 23B and the paste deposition mechanisms 29A and 29B connected to the deposition mechanism lifting mechanisms 24A and 24B are also horizontally moved. In a state where the closed type squeegee mechanism 13 is moved downward, the closed type squeegee mechanism 13 is horizontally moved on the mesh mask 12, by driving the motor 28. In other words, the motor 28, the feeding screw 27 and the nut member 26 constitute the Y-axis moving mechanism 21 for horizontally moving the closed type squeegee mechanism 13 on the mesh mask 12.

The printing portion 14 which packs the paste P into the pattern holes 12a, in a state of abutting on a surface of the mesh mask 12, is provided on the lower portion of the closed type squeegee mechanism 13. A main body portion 30 constituting the printing portion 14 is a block-shaped member having an elongated shape in a width direction of the mesh mask 12. The length of the main body portion 30 is set so as to cover the width of the substrate 8 as a printing object. A concave portion 30a is formed on the main body portion 30 such that a cartridge 31 storing the paste P is detachably mounted thereto.

The predetermined amount of paste P is stored in the cartridge 31 in advance, and the cartridge 31 is mounted on the main body portion 30 when performing printing. A compressing plate 32 for compressing the paste P in the inner portion is fit in the opening on the upper surface of the cartridge 31. The compressing plate 32 is connected to a rod 16a of the cylinder 16 disposed on the upper side thereof. The compressing plate 32 is reciprocatively moved in the cartridge 31 by driving the cylinder 16. By driving the cylinder 16 at a predetermined pressure, the paste P in the cartridge 31 is pushed downward at a predetermined pressure by the compressing plate 32.

A bottom surface of the cartridge 31 is an extruding plate 31a with respect to the paste P, and a plurality of openings 31b are provided on the extruding plate 31a. A diaphragm plate 33 mounted on the bottom portion of the main body portion 30 is disposed on the lower side of the extruding plate 31a. As similar to the extruding plate 31a of the cartridge 31, a plurality of openings 33a are provided on the diaphragm plate 33. A pair of sliding members 34A and 34B opposed to each other in a downward-narrowed state extend downward from a lower surface side of the main body portion 30 storing the paste P, in a state of aligning a facing direction thereof with the squeezing direction. A space surrounded by two pieces of sliding members 34A and 34B and the lower surface of the main body portion 30 constitutes a printing space 35 for accommodating the paste P. An opening portion between two pieces of sliding members 34A and 34B forms a printing opening 35a which carries out printing by packing the compressed paste P into the pattern holes 12a of the mesh mask 12.

The paste P in the cartridge 31 is compressed by being pressed downward by the cylinder 16. Then, the paste P passes through the opening 31b of the extruding plate 31a and the opening 33a of the diaphragm plate 33 and is extruded downward in a squeezed state. Since the paste P is squeezed as described above, the viscosity of the paste P is lowered so that the property thereof is modified to be suitable for screen printing. Then, the extruded paste P reaches the printing space 35 surrounded by the pair of sliding members 34A and 34B facing each other and the lower surface of the main body portion 30.

The sliding members 34A and 34B are plate-shaped members having flexibility and form leading and following walls of the printing space 35 in the squeezing direction. In a state where the closed type squeegee mechanism 13 is moved downward, the lower end portions of the sliding members 34A and 34B abut on the upper surface of the mesh mask 12. In the printing operation, the paste P stored in the cartridge 31 in the main body portion 30 is compressed while the sliding members 34A and 34B are slid in the squeezing direction in a state of abutting on the upper surface of the mesh mask 12. Therefore, the paste P is packed into the pattern holes 12a via the printing opening 35a formed between the sliding members 34A and 34B.

The paste P is sequentially packed into each of the pattern holes 12a by moving the closed type squeegee mechanism 13. If the paste P is packed into all of the pattern holes 12a, the substrate 8 is moved downward held by the substrate underlaid bracket portion 7, by driving the first Z-axis table 6A. Therefore, the screen printing of the paste P is completed with respect to the substrate 8. Since the paste P is packed into the pattern holes 12a in a state of being compressed, it is possible to secure a favorable packing property even when a mesh mask having difficulty in packing property is used as the mesh mask 12 in the screen printing.

The screen printing device is configured as above. Next, a screen printing method performed by the screen printing device will be described with reference to FIGS. 4A to 4D, FIGS. 5A to 5D, FIGS. 6A to 6C and FIGS. 7A to 7C. In this case, a direction from the left side in the drawings toward the right side thereof is designated as the outward path direction of the squeezing direction. That is, when a pair of left and right clamp members 9 are respectively designated as clamp members 9A and 9B so as to be distinguished from each other, a direction from the clamp member 9A toward the clamp member 9B is the outward path direction.

Figure 4A:
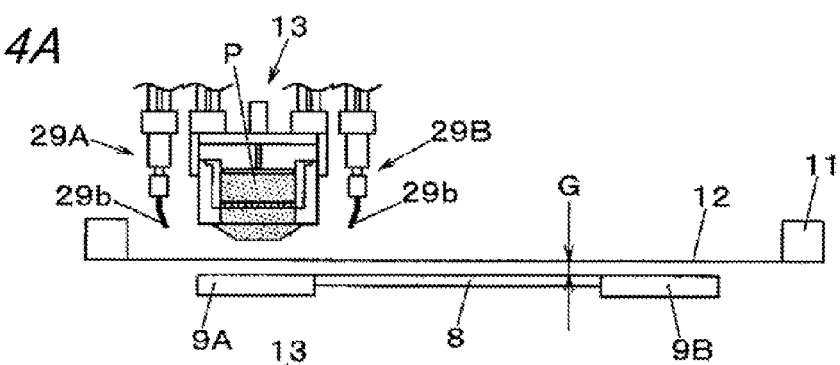
FIGS. 4A to 4D are operation explanatory views of a squeezing operation by the screen printing device according to the embodiment of the invention.

First, the substrate 8 of a printing object is transported to the substrate positioning portion 2. The substrate 8 is received and held by the substrate underlaid bracket portion 7, by driving the second Z-axis table 6B. Then, the clamp members 9A and the clamp members 9B clamp the substrate 8 from both sides thereof. Next, the substrate 8 received and held by the substrate underlaid bracket portion 7 is positioned with respect to the mesh mask 12 (a substrate positioning step). In other words, as shown in FIG. 4A, the substrate 8 is held at the position vertically separate from the lower surface of the mesh mask 12 by a predetermined gap G by moving the first Z-axis table 6A upward, while a horizontal-positioning of the substrate 8 is performed with respect to the mesh mask 12 by the substrate positioning portion 2.

Figure 4B:
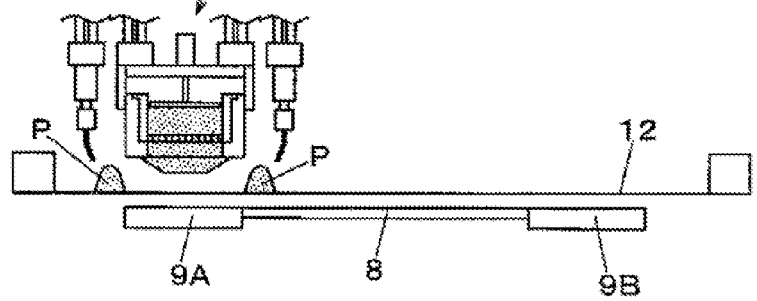
Figure 4C:
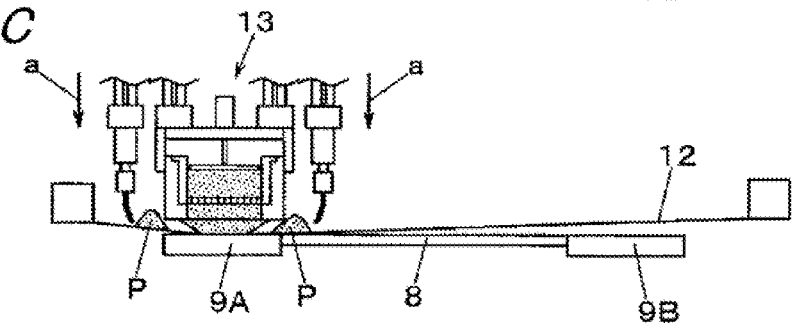

Subsequently, the paste P is supplied to the outside of the closed type squeegee mechanism 13 on the upper surface of the mesh mask 12 (a paste supplying step). That is, in the clamp member 9A side which is the starting point of squeezing, the paste P is supplied on the front and rear sides of the closed type squeegee mechanism 13, as shown in FIG. 4B. Then, the paste P is packed into the pattern holes 12a by an outward path and returning path operations for reciprocatively move the closed type squeegee mechanism 13 on the upper surface of the mesh mask 12, whereby the paste P is printed on the substrate 8 (a printing executing step). First, when the outward path operation is to start, the closed type squeegee mechanism 13 is moved downward (an arrow a) by driving the squeegee lifting mechanisms 23A and 23B so that the sliding member 34A and the sliding member 34B (see FIG. 3) are pushed to the upper surface of the mesh mask 12, whereby the lower surface of the mesh mask 12 abuts on the clamp member 9A which is the starting point of squeezing, as shown in FIG. 4C.

Figure 4D:
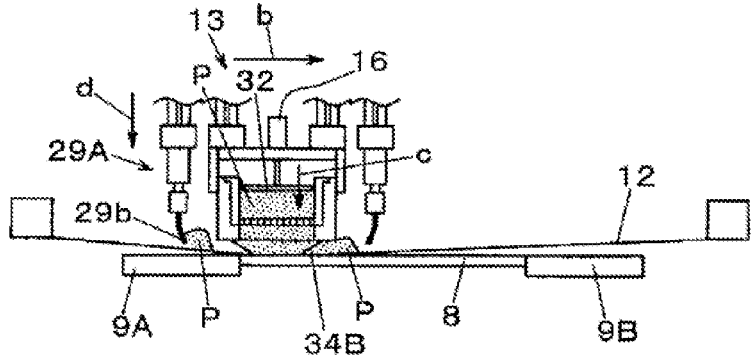

At the same time, a depositing operation for forming the paste film P* which covers the pattern holes 12a immediately after the packing of the paste P in the outward path operation is prepared. That is, the deposition member 29b of the paste deposition mechanism 29A is moved close to the upper surface of the mesh mask 12 (an arrow d) by driving the deposition mechanism lifting mechanism 24A (see FIG. 3), as shown in FIG. 4D. At this time, the paste P supplied to the mesh mask 12 is positioned at the front and rear sides of the closed type squeegee mechanism 13.

In this state, the closed type squeegee mechanism 13 is moved in the outward path direction (a direction of an arrow b) by driving the Y-axis moving mechanism 21 so that the sliding member 34A and the sliding member 34B slide on the mesh mask 12. At this time, the compressing plate 32 is pushed down by the cylinder 16 (an arrow c) such that the paste P in the closed type squeegee mechanism 13 is compressed, and therefore the paste P is packed into the pattern holes 12a of the mesh mask 12. The paste deposition mechanism 29A is moved in synchronization with the closed type squeegee mechanism 13 while the paste P is packed, so that the depositing operation is performed for forming the paste film P* which covers the pattern holes 12a packed with the paste P in the outward path operation.

Figure 6A:
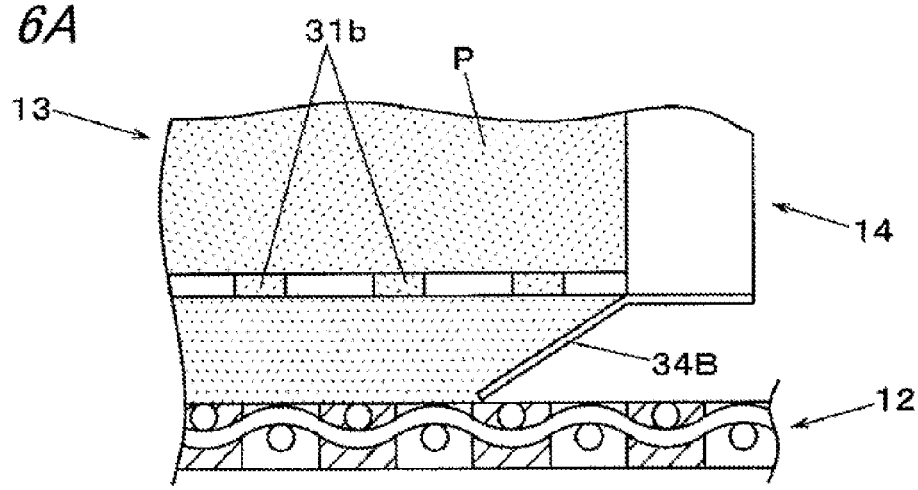
FIGS. 6A to 6C are explanatory views of packing paste, in the squeezing operation by the screen printing device according to the embodiment of the invention.

A packing operation of the paste P in the outward path operation will be described with reference to FIGS. 6A to 6C. FIG. 6A shows a packing state of the paste P with respect to the pattern holes 12a, during the travelling of the printing portion 14 in the outward path direction in a state where the sliding member 34A and the sliding member 348 are in a sliding-contact with the mesh mask 12. In the squeezing step, the sliding member 34B positioned on a leading side of the traveling direction in the outward path operation between the pair of sliding members 34A and 348 is moved in the squeezing direction before the packing of the paste P into the pattern holes 12a via the printing opening 35a between the sliding member 34A and the sliding member 34B of the printing portion 14. Therefore, the paste P supplied to the outside of the closed type squeegee mechanism 13 is packed into the pattern holes 12a.

Figure 6B:
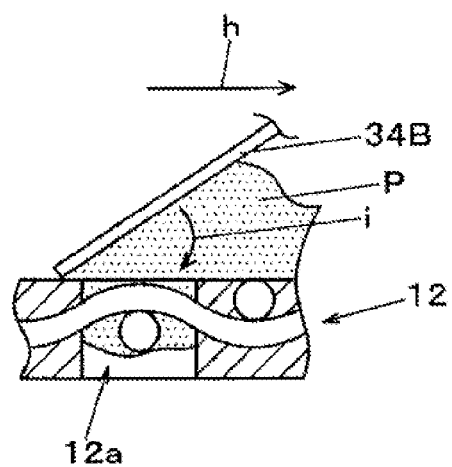
Figure 6C:
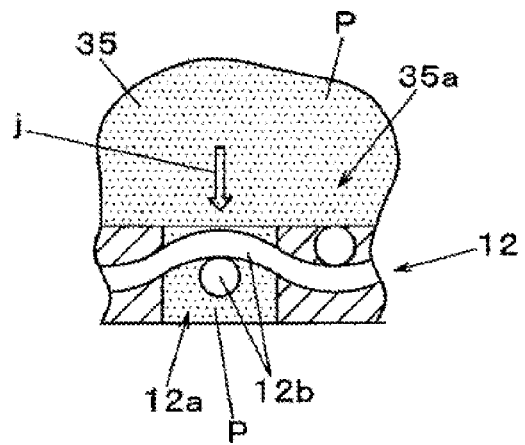

In other words, in accordance with the movement of the closed type squeegee mechanism 13, the sliding member 38B rakes the paste P which is supplied to the outside of the closed type squeegee mechanism 13, in a travelling direction (a direction of an arrow h) along the upper surface of the mesh mask 12, as shown in FIG. 6B. A flow in a rolling direction (a direction of an arrow i) is generated in the paste P by the movement of the sliding member 34B. As a result, the paste P on the mesh mask 12 is filled into the pattern holes 12a. At this time, the flow of the paste P is hindered because the mesh portion 12b is present in the pattern holes 12a. Therefore, the paste P is not completely packed into the pattern holes 12a, in this step.

Next, the closed type squeegee mechanism 13 is further moved in the squeezing direction, and therefore the pattern holes 12a is positioned under the printing opening 35a between the sliding member 34A and the sliding member 34B. In this state, the paste P in the printing space 35 is pushed to the pattern holes 12a by pressure (an arrow j) generated by a pressing force of the compressing plate 32. Therefore, the paste P which is insufficiently packed into the pattern holes 12a in the squeezing step by the sliding member 34B is further pushed into the pattern holes 12a. As a result, it is possible to achieve a favorable packing state even on the mesh mask 12 having the mesh portion 12b in the pattern holes 12a.

Figure 7A:
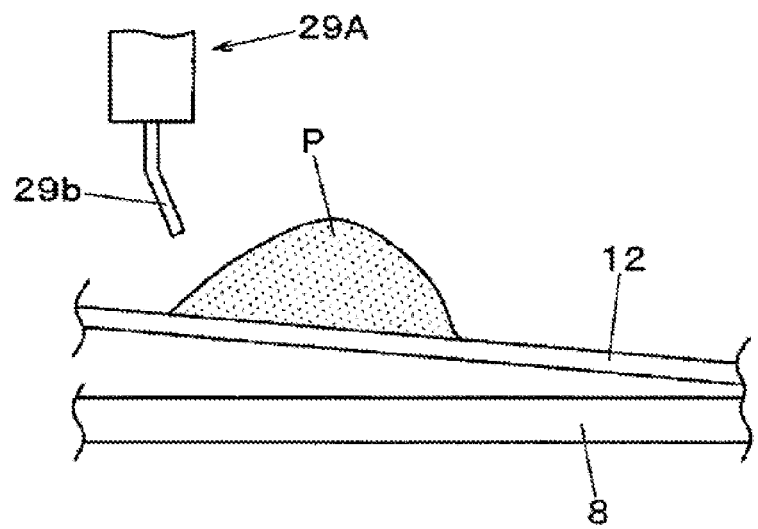
FIGS. 7A to 7C are explanatory views of past depositing, in the squeezing operation by the screen printing device according to the embodiment of the invention.
Figure 7B:
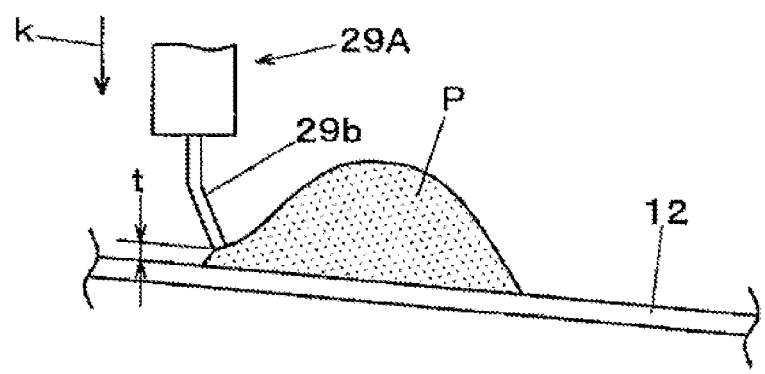
Figure 7C:
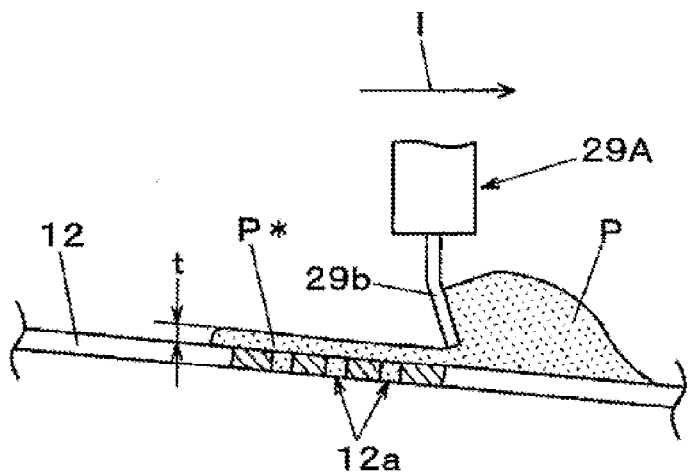

Next, the depositing operation in the squeezing operation described above will be described with reference to FIGS. 7A to 7C. In FIG. 7A, the paste P is supplied on the mesh mask 12, the deposition member 29b of the paste deposition mechanism 29A is positioned separate from the mesh mask 12. Then, the process proceeds to the depositing operation. In the depositing operation, first, as shown in FIG. 7B, the deposition member 29b is moved downward (an arrow k) so that the vertical position of the deposition member 29b is held at a position where a deposition gap corresponding to a specific paste film thickness t is held between the lower end portion of the deposition member 29b and the upper surface of the mesh mask 12. In this state, the paste deposition mechanism 29A is moved in the outward path direction (a direction of an arrow i). Therefore, the paste P on the mesh mask 12 is spread by the deposition member 29b, as shown in FIG. 7C, whereby the paste film P* having a predetermined thickness t is formed on the upper surface of the mesh mask 12. The paste film P* covers the upper surface of the pattern holes 12a of the mesh mask 12. Therefore, it is possible to effectively prevent clogging in the pattern holes 12a which is induced by drying and solidifying of the paste P in the pattern holes 12a when directly exposed to the air.

Figure 5A:
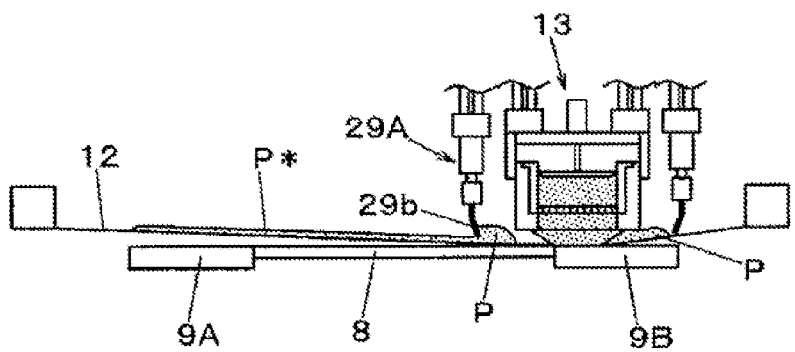
FIGS. 5A to 5D are operation explanatory views of a squeezing operation by the screen printing device according to the embodiment of the invention.

FIG. 5A shows a state where the packing of the paste P by the closed type squeegee mechanism 13 with respect to all of the pattern holes 12a in the outward path operation and the forming of the paste film P* covering the pattern holes 12a after the packing are completed. In this state, the closed type squeegee mechanism 13 is positioned on the clamp member 9B. Also, a remnant of the paste P which has been supplied before the squeezing operation is remained on the front and rear sides of the closed type squeegee mechanism 13 in the squeezing direction.

Figure 5B:
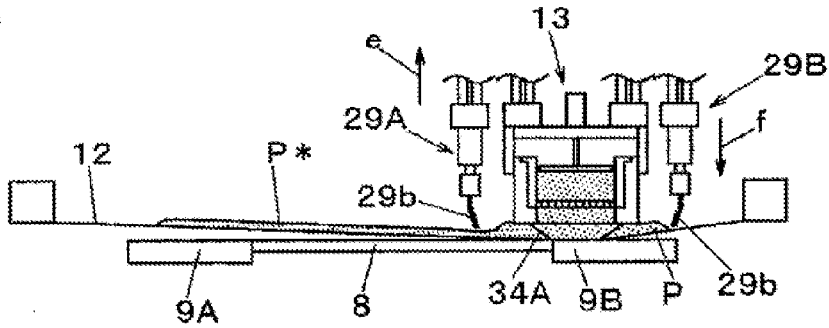

Thereafter, the returning path operation for moving the closed type squeegee mechanism 13 from the clamp member 9B side toward the clamp member 9A side is executed. In the returning path operation, the packing operation where the paste P is packed into the pattern holes 12a with respect to a new substrate 8 by sliding the closed type squeegee mechanism 13 on the upper surface of the mesh mask 12 is executed while the depositing operation is executed for forming the paste film P* covering the pattern holes 12a after the packing of the paste P is performed. In this case, the paste deposition mechanism 29A is moved upward (an arrow e) and the paste deposition mechanism 29B is moved downward so that the deposition member 29b is moved close to the upper surface of the mesh mask 12, as shown in FIG. 5B (an arrow f).

Figure 5C:
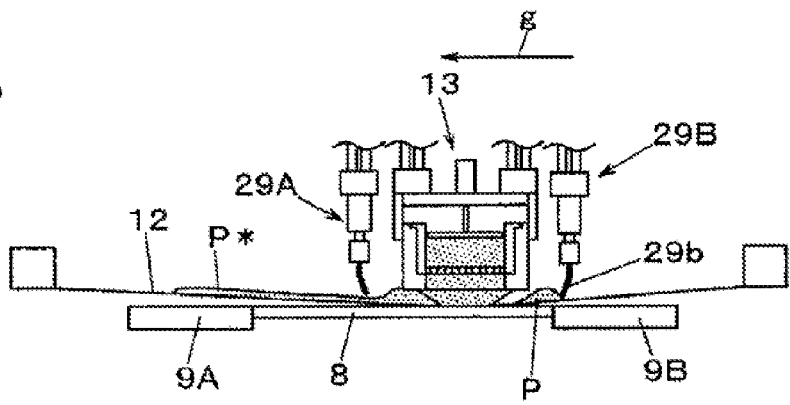
Figure 5D:
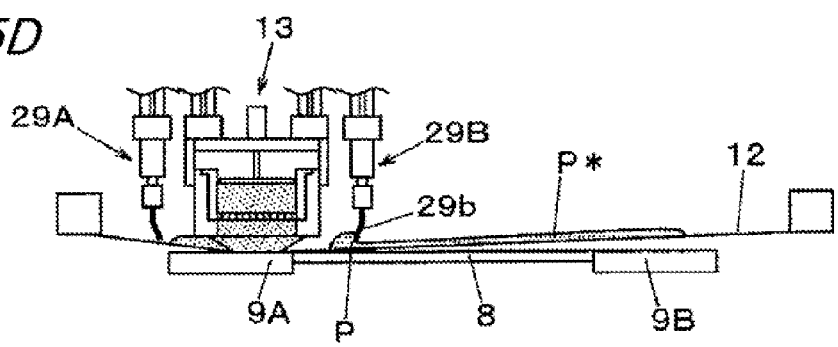

Then, the closed type squeegee mechanism 13 and the paste deposition mechanism 29B are integrally moved in the returning path direction, namely a direction (an arrow g) from the clamp member 9B toward the clamp member 9A, as shown in FIG. 5C. In the returning path operation, the sliding member 34A positioned on the leading side in the traveling direction is moved in the squeezing direction before the packing of the paste P by the pressure force via the printing opening 35a, as similar to the outward operation, so that the paste P which is the scraped paste P on the mesh mask 12 and the scraped paste film P* formed in the outward path operation is packed into the pattern holes 12a. At the same time, the paste P on the mesh mask 12 is spread due to the deposition member 29b by moving the paste deposition mechanism 29B in the returning path direction. Therefore, the paste film P* having a predetermined thickness t is formed on the upper surface of the mesh mask 12. FIG. 5D shows a state where, in the returning path operation, the packing of the paste P by the closed type squeegee mechanism 13 with respect to all of the pattern holes 12a and the forming of the paste film P* covering the pattern holes 12a after the packing are completed. In this state, the closed type squeegee mechanism 13 is positioned on the clamp member 9A. Thereafter, the same operation is repeatedly executed corresponding to the carrying of the substrate 8 in or out.

According to the screen printing of the embodiment, in the outward path and returning path operations for reciprocatively moving the closed type squeegee mechanism 13 in the squeezing direction, the paste P supplied to the outside of the closed type squeegee mechanism 13 on the upper surface of the mesh mask 12 is spread due to the deposition members 29b by moving the deposition members 29b of the paste deposition mechanisms positioned on the following side in the traveling direction of the closed type squeegee mechanism 13, in the traveling direction in a state close to the upper surface of the mesh mask 12, and therefore the paste film P* having a predetermined thickness is formed, as described above. Thus, it is possible to cover the upper surface of the mesh mask 12 by the paste film P* immediately after the packing of the paste P into the pattern holes 12a, and therefore it is possible to prevent a printing failure caused by drying of the paste P in the pattern holes 12a.

Furthermore, according to the screen printing of the embodiment, in the outward path and returning path operations of the printing executing step where the closed type squeegee mechanism 13 is reciprocatively moved in the squeezing direction, the paste P supplied to the outside of the closed type squeegee mechanism 13 on an upper surface of a mesh mask 12 is packed into the pattern holes 12a by moving the sliding member 34b positioned on the leading side in the squeezing direction between the pair of sliding members 34A and 34B, in the squeezing operation which is performed by the closed type squeegee mechanism 13 comprised to packing the paste compressed internally from the printing opening 35a between the pair of sliding members 34A and 34B, before the packing of the paste P into the pattern holes 12a via the printing opening 35a.

Therefore, since the paste P is packed via the printing opening 35a, it is possible to further improve the packing property so that it is possible to secure a favorable packing property with respect to the mesh mask 12 having a high degree of difficulty in printing. Further, printing is performed on the mesh mask 12 in the manner of off-contact printing, in the example of the embodiment. However, the invention also can be applied to the case of off-contact printing where the squeezing is performed by causing the entire surface of the mesh mask 12 to abut on the substrate 8.

This application is based on Japanese Patent Application No. 2011-051207 filed on Mar. 9, 2011. The entire contents thereof noted above are included in this application.

INDUSTRIAL APPLICABILITY

A screen printing device and a screen printing method of the invention have an effect capable of preventing a printing failure caused by drying of paste in the pattern holes. Also, it is useful in solder printing using a mesh mask having a high degree of difficulty in packing.

REFERENCE SIGNS LIST

1: screen printing device
2: substrate positioning portion

7: substrate underlaid bracket portion
8: substrate
10: screen printing portion
12: mesh mask
12a: pattern hole
12b: mesh portion
13: closed type squeegee mechanism
14: printing portion
20: squeegee moving mechanism
21: Y-axis moving mechanism
29A, 29B: paste deposition mechanism
29b: deposition member
30: main body portion
34A, 34B: sliding member
35: printing space
35a: printing opening
P: paste
P*: paste film

The invention claimed is:

1. A screen printing device for printing paste on a substrate via pattern holes by performing a reciprocating squeezing operation in which a squeegee unit reciprocatively slides in a squeezing direction in a state of abutting on an upper surface of a mask formed with the pattern holes, comprising:
a substrate underlaid bracket portion which receives and holds the substrate;
a squeegee moving mechanism which causes the squeegee unit to be moved upward or downward and moved reciprocatively in the squeezing direction, and
two paste deposition mechanisms which are disposed on outward path and returning path sides of the squeegee unit in the squeezing direction, reciprocatively movable in synchronization with the squeegee unit, and each of the two paste deposition mechanisms having a deposition member moving upward or downward with respect to the mask,
wherein the squeegee unit is a closed type squeegee mechanism which is configured so that a pair of sliding members opposed to each other in a downward-narrowed state extend downward from a lower surface side of a main body portion storing the paste so as to align a facing direction thereof with the squeezing direction, and compresses the paste stored in the main body portion and reciprocatively slides the pair of sliding members in the squeezing direction in a state of being abutted on the upper surface of the mask so that the paste is packed into the pattern holes via a printing opening provided between the pair of sliding members, and
wherein, in outward path and returning path operations for reciprocatively moving the squeegee unit in the squeezing direction, the paste supplied to an outside of the closed type squeegee mechanism on the upper surface of the mask is spread due to the deposition member by moving, in a traveling direction, the deposition member of one of the two paste deposition mechanisms positioned on a following side in the traveling direction, in a state close to the upper surface of the mask, thereby forming a paste film having a predetermined thickness.

2. The screen printing device according to claim 1, wherein, in the outward path and returning path operations, the pair of sliding members positioned on a leading side in the traveling direction with regard to an outward path or a returning path, between the pair of sliding members, is moved in the squeezing direction before the packing of the paste into the pattern holes via the printing opening so that the paste supplied to the outside of the closed type squeegee mechanism on the upper surface of the mask is packed into the pattern holes.

3. A screen printing method for printing paste on a substrate via pattern holes by performing a reciprocating squeezing operation in which a squeegee unit reciprocatively slides in a squeezing direction in a state of abutting on an upper surface of a mask formed with the pattern holes, in which the squeegee unit is a closed type squeegee mechanism which is configured so that a pair of sliding members opposed to each other in a downward-narrowed state extend downward from a lower surface side of a main body portion storing the paste so as to align a facing direction thereof with the squeezing direction, and compresses the paste stored in the main body portion and reciprocatively slides the pair of sliding members in the squeezing direction in a state of being abutted on the upper surface of the mask so that the paste is packed into the pattern holes via a printing opening provided between the pair of sliding members, and further two paste deposition mechanisms, each of the deposition mechanisms is reciprocatively movable in synchronization with the squeegee unit and has a deposition member moving upward or downward with respect to the mask, are disposed on an outward path and returning path sides of the squeegee unit in the squeezing thereof, the method comprising:
a substrate positioning step which positions the substrate received and held by a substrate underlaid bracket portion, with respect to the mask;
a paste supplying step which supplies the paste to an outside of the closed type squeegee mechanism on the upper surface of the mask; and
a printing executing step which reciprocatively moves the squeeze unit on the upper surface of the mask,
wherein, in outward path and returning path operations of the printing executing step for reciprocatively moving the squeegee unit in the squeezing direction, the paste supplied to the outside of the closed type squeegee mechanism on the upper surface of the mask is spread due to the deposition member by moving, in a traveling direction, the deposition member of one of the paste deposition mechanisms positioned on a following side in the traveling direction, in a state close to the upper surface of the mask, thereby forming a paste film having a predetermined thickness.

4. The screen printing method according to claim 3, wherein, in the outward path and returning path operations, one of the pair of sliding members positioned on a leading side in the traveling direction with regard to an outward path or a returning path, between the pair of sliding members, is moved in the squeezing direction before the packing of the paste into the pattern holes via the printing opening so that the paste supplied to the outside of the closed type squeegee mechanism on the upper surface of the mask is packed into the pattern holes.

* * * * *